US012590990B2

(12) United States Patent
Cheng et al.

(10) Patent No.: US 12,590,990 B2
(45) Date of Patent: Mar. 31, 2026

(54) CANTILEVER PROBE CARD DEVICE AND MICRO ELECTRO MECHANICAL SYSTEM (MEMS) PROBE

(71) Applicant: CHUNGHWA PRECISION TEST TECH. CO., LTD., Taoyuan City (TW)

(72) Inventors: Hao-Yen Cheng, Taoyuan City (TW); Rong-Yang Lai, Taoyuan City (TW); Chao-Hui Tseng, New Taipei City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 134 days.

(21) Appl. No.: 18/632,310

(22) Filed: Apr. 11, 2024

(65) Prior Publication Data

US 2024/0385218 A1 Nov. 21, 2024

(30) Foreign Application Priority Data

May 18, 2023 (TW) ................................. 112118412

(51) Int. Cl.
G01R 1/067 (2006.01)
G01R 1/073 (2006.01)

(52) U.S. Cl.
CPC ..... G01R 1/06727 (2013.01); G01R 1/07342 (2013.01)

(58) Field of Classification Search
CPC ......... G01R 1/06–06727; G01R 1/073–07364; G01R 3/00
See application file for complete search history.

(56) References Cited

U.S. PATENT DOCUMENTS

| | | | | |
|---|---|---|---|---|
| 2002/0146920 A1* | 10/2002 | Sugiyama | ............ | H05K 3/3421 |
| | | | | 439/66 |
| 2005/0179458 A1* | 8/2005 | Chen | .................. | G01R 1/06744 |
| | | | | 324/755.07 |
| 2005/0200375 A1* | 9/2005 | Sudin | ................. | G01R 1/06722 |
| | | | | 324/755.05 |

(Continued)

FOREIGN PATENT DOCUMENTS

WO WO-2019089611 A1 * 5/2019 ......... G01R 1/06722

*Primary Examiner* — Huy Q Phan
*Assistant Examiner* — David B Frederiksen
(74) *Attorney, Agent, or Firm* — Li & Cai Intellectual Property Office

(57) ABSTRACT

A micro electro mechanical system (MEMS) probe includes an arm segment, a main segment, and a testing segment. The main segment is arranged at one side of the arm segment, the main segment defines a layout region arranged inside of an outer contour thereof, and the main segment has a soldering end portion and an extending end portion respectively arranged at two opposite sides of the distribution region along a predetermined direction. The testing segment has an upright shape along the predetermined direction and is connected to another side of the arm segment. The layout region has a plurality of thru-holes that occupy 3% to 70% of a region surroundingly defined by the outer contour. The layout region is spaced apart from the outer contour by a layout spacing that is less than or equal to an inner diameter of any one of the thru-holes.

12 Claims, 10 Drawing Sheets

(56) References Cited

U.S. PATENT DOCUMENTS

2010/0229265 A1* 9/2010 Jin ......................... G01Q 60/56
850/60
2013/0088251 A1* 4/2013 Choi ....................... G01R 3/00
156/280
2016/0109481 A1* 4/2016 Chen .................. G01R 1/06727
324/755.07
2016/0178668 A1* 6/2016 Choi .................. G01R 1/07307
324/756.03

* cited by examiner

CANTILEVER PROBE CARD DEVICE AND MICRO ELECTRO MECHANICAL SYSTEM (MEMS) PROBE

CROSS-REFERENCE TO RELATED PATENT APPLICATION

This application claims the benefit of priority to Taiwan Patent Application No. 112118412, filed on May 18, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a cantilever probe card, and more particularly to a cantilever probe card device and a micro electro mechanical system (MEMS) probe.

BACKGROUND OF THE DISCLOSURE

A conventional cantilever probe card includes a substrate and a plurality of cantilever probes that are mounted on the substrate and that have substantially the same shape. The cantilever probes can be produced in a MEMS manner, but one side of any one of the cantilever probes is coated with a photoresist layer that needs to be removed by a specific solution. However, when the photoresist layer is formed on a larger region of any one of the cantilever probes, the photoresist layer can be difficult to be removed by the specific solution, thereby reducing a production yield.

SUMMARY OF THE DISCLOSURE

In response to the above-referenced technical inadequacies, the present disclosure provides a cantilever probe card device and a micro electro mechanical system (MEMS) probe for effectively improving on the issues associated with conventional cantilever probe cards.

In order to solve the above-mentioned problems, one of the technical aspects adopted by the present disclosure is to provide a cantilever probe card device, which includes a substrate and a plurality of micro electro mechanical system (MEMS) probes fixed onto the substrate. The substrate includes a plurality of soldering pads. Each of the MEMS probes includes an arm segment, a main segment located at one side of the arm segment, and a testing segment connected to another side of the arm segment. The main segment defines a layout region arranged inside of an outer contour thereof, and the main segment has a soldering end portion and an extending end portion respectively located at two opposite sides of the layout region along a predetermined direction. The testing segment has an upright shape along the predetermined direction. In each of the MEMS probes, the layout region has a plurality of thru-holes that occupy 3% to 70% of a region surroundingly defined by the outer contour. The layout region is spaced apart from the outer contour by a layout spacing that is greater than or equal to an inner diameter of any one of the thru-holes. The MEMS probes are fixed onto the soldering pads of the substrate through the soldering end portions of the main segments thereof.

In order to solve the above-mentioned problems, another one of the technical aspects adopted by the present disclosure is to provide a micro electro mechanical system (MEMS) probe, which includes an arm segment, a main segment located at one side of the arm segment, and a testing segment connected to another side of the arm segment. The main segment defines a layout region arranged inside of an outer contour thereof, and the main segment has a soldering end portion and an extending end portion respectively located at two opposite sides of the layout region along a predetermined direction. The testing segment has an upright shape along the predetermined direction. The layout region has a plurality of thru-holes that occupy 3% to 70% of a region surroundingly defined by the outer contour, and the layout region is spaced apart from the outer contour by a layout spacing that is greater than or equal to an inner diameter of any one of the thru-holes.

Therefore, in any one of the cantilever probe card device and the MEMS probe of the present disclosure, the layout region has the thru-holes, so that the solution in the MEMS process can completely remove the photoresist layer by flowing through the thru-holes, thereby increasing the production yield.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
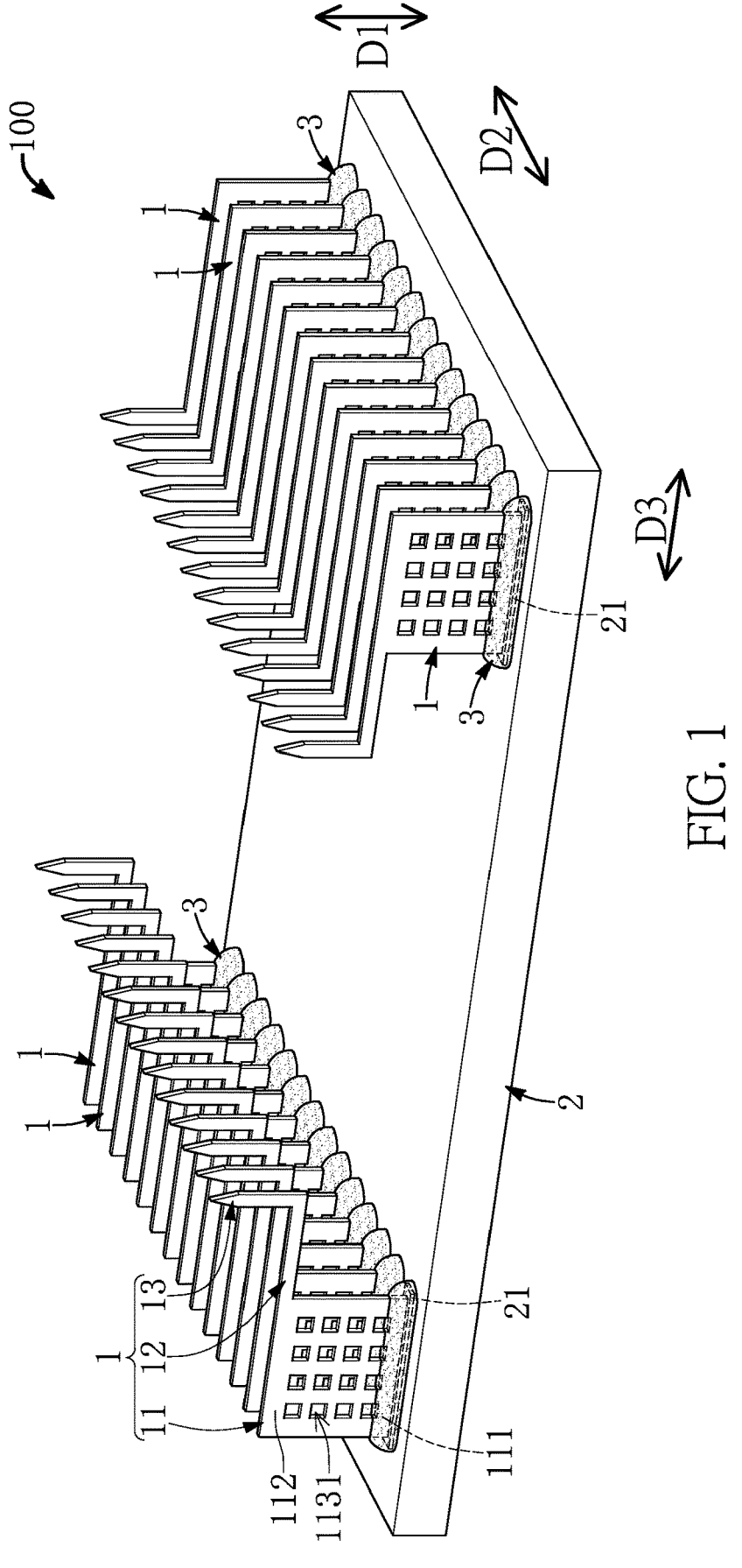
FIG. 1 is a schematic perspective view of a cantilever probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a cantilever probe card device 100, which includes a substrate 2, a plurality of solders 3, and a plurality of micro electro mechanical system (MEMS) probes 1 that are fixed onto the substrate 2 through the solders 3, but the present disclosure is not limited thereto. It should be noted that any probe not in a cantilever mode and not manufactured in a MEMS manner is different from the MEMS probe 1 provided by the present embodiment.

In the present embodiment, the MEMS probes 1 are arranged in two rows respectively disposed on two opposite portions of the substrate 2, but the present disclosure is not limited thereto. For example, in other embodiments of the present disclosure not shown in the drawings, the MEMS probes 1 can be arranged in four rows disposed on a peripheral portion of the substrate 2 in an annular arrangement; or, the MEMS probes 1 can be arranged in one row. In order to clearly describe the present embodiment, the following description discloses the structure of just one row of the MEMS probes 1.

In addition, the MEMS probes 1 in the present embodiment are described in cooperation with the substrate 2 and the solders 3, but the present disclosure is not limited thereto. For example, in other embodiments of the present disclosure not shown in the drawings, the MEMS probe 1 can be independently used (e.g., sold) or can be used in cooperation with other components.

In the present embodiment, the substrate 2 is a flat board and defines a predetermined direction D1 perpendicular thereto, an arrangement direction D2 perpendicular to the predetermined direction D1, and an extending direction D3 that is perpendicular to the predetermined direction D1 and the arrangement direction D2, but the present disclosure is not limited thereto. Specifically, the substrate 2 includes a plurality of soldering pads 21 arranged in one row along the arrangement direction D2.

Each of the MEMS probes 1 is integrally formed as a single one-piece structure. As the MEMS probes 1 in the present embodiment are of substantially the same structure (e.g., outer contours of the MEMS probes 1 are flush with each other along the arrangement direction D2), the following description discloses the structure of just one of the MEMS probes 1 for the sake of brevity, but the present disclosure is not limited thereto. For example, in other embodiments of the present disclosure not shown in the drawings, the MEMS probes 1 can be of different structures.

Figure 2:
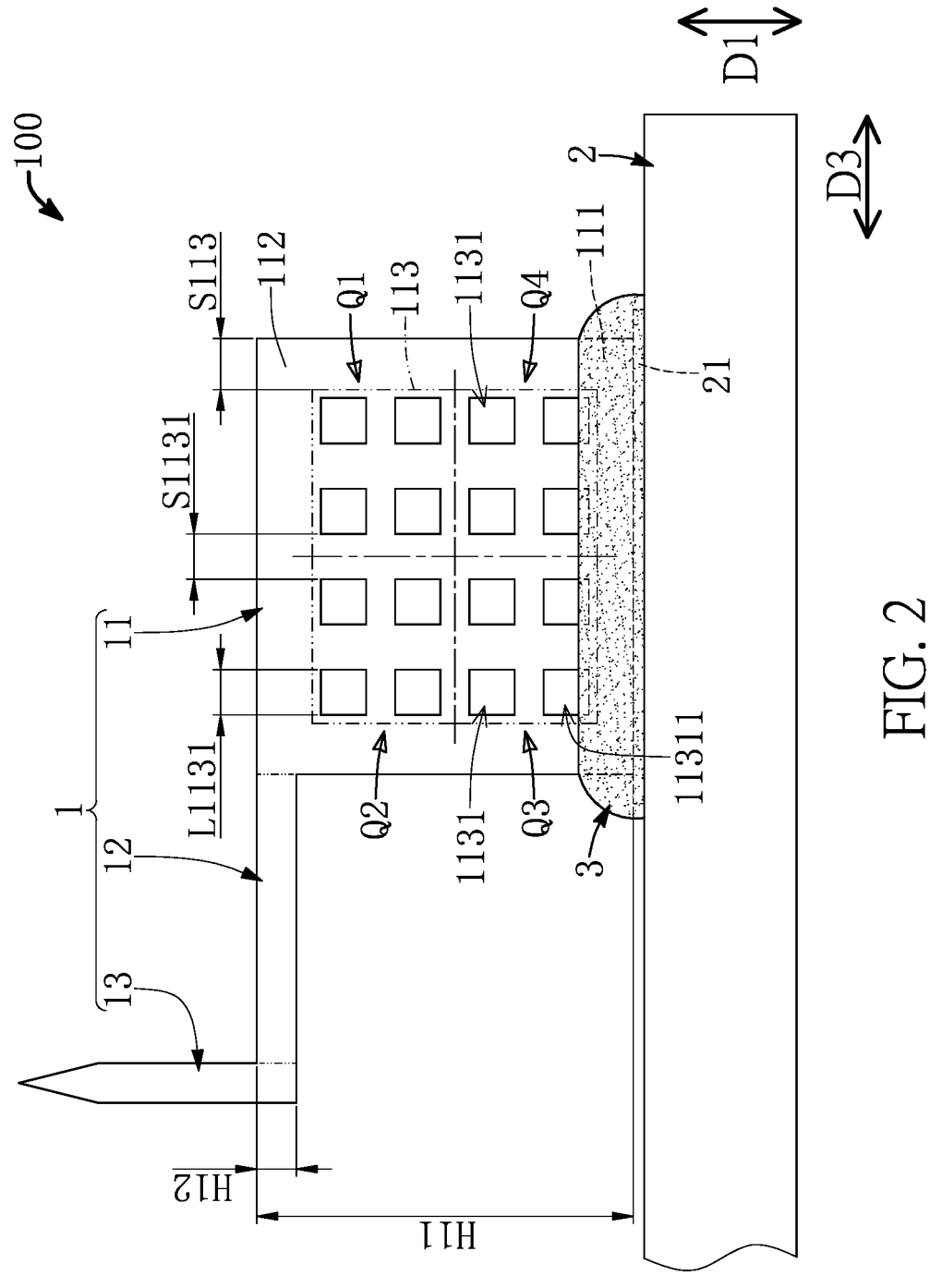
FIG. 2 is a schematic side view showing a part of FIG. 1.
Figure 3:
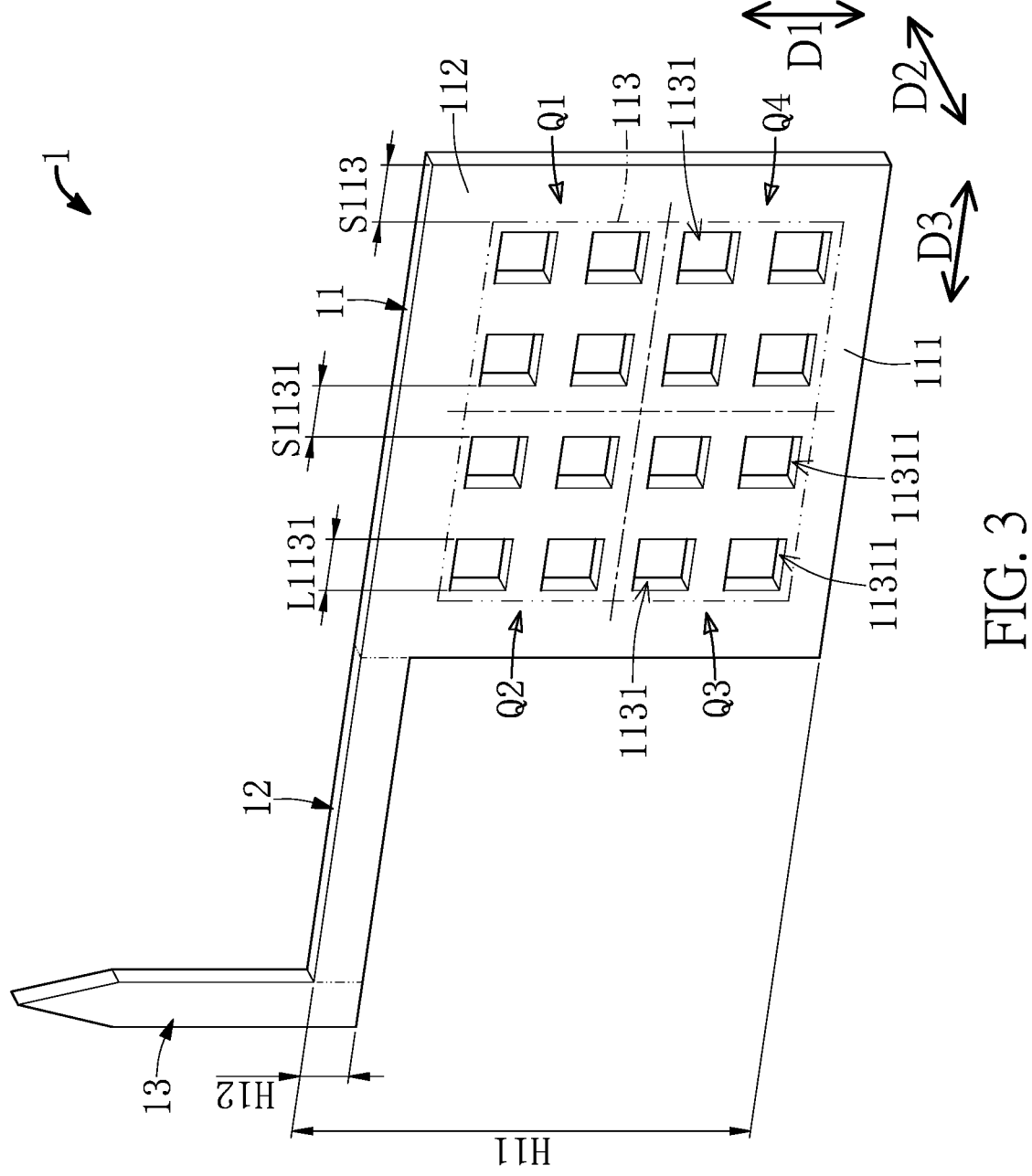
FIG. 3 is a schematic perspective view showing a micro electro mechanical system (MEMS) probe of FIG. 1.

As shown in FIG. 1 to FIG. 3, the MEMS probe 1 includes a main segment 11, an arm segment 12 connected to the main segment 11, and a testing segment 13 that is connected to the arm segment 12. In other words, the main segment 11, the arm segment 12, and the testing segment 13 are sequentially connected along the extending direction D3. Specifically, the main segment 11 and the testing segment 13 are respectively connected to two opposite ends of the arm segment 12, and are respectively located at two diagonal sides of the arm segment 12.

In the present embodiment, the main segment 11 has a substantially sheet-like shape (e.g., a rectangular sheet), and the main segment 11 has a soldering end portion 111 and an extending end portion 112 respectively arranged on two opposite sides thereof along the predetermined direction D1. The arm segment 12 is an elongated structure along the extending direction D3, and one end of the arm segment 12 is connected to the extending end portion 112 of the main segment 11. The testing segment 13 has an upright shape along the predetermined direction D1 and is connected to another end of the arm segment 12.

In other words, an edge of the soldering end portion 111 is flush with an edge of the arm segment 12 so as to jointly form a straight line that is substantially perpendicular to an edge of the testing segment 13. Moreover, along the predetermined direction D1, a height H12 of the arm segment 12 is within a range from 5% to 50% of a height H11 of the main segment 11, the arm segment 12 is elastically deformable, and the main segment 11 does not have any deformation.

Specifically, the main segment 11 defines a layout region 113 arranged inside of an outer contour thereof, and the soldering end portion 111 and the extending end portion 112 are respectively located at two opposite sides of the layout region 113 along the predetermined direction D1. The layout region 113 has a plurality of thru-holes 1131 that occupy 3% to 70% of a region surroundingly defined by the outer contour of the main segment 11.

In the present embodiment, the thru-holes 1131 are in a matrix arrangement having a plurality of rows, and the thru-holes 1131 are uniformly distributed on the main segment 11. In other words, the main segment 11 is divided into four quadrants Q1, Q2, Q3, Q4 by taking a center point thereof as an origin point, and a ratio of thru-holes 1131 in any one of the four quadrants Q1, Q2, Q3, Q4 is within a range from 95% to 105% of a ratio of the thru-holes 1131 in another one of the four quadrants Q1, Q2, Q3, Q4, but the present disclosure is not limited thereto.

Specifically, the layout region 113 is spaced apart from the outer contour of the main segment 11 by a layout spacing S113 that is greater than or equal to an inner diameter L1131 of any one of the thru-holes 1131. In the present embodiment, the layout spacing S113 is preferably within a range from 20 μm to 100 μm, the inner diameter L1131 of any one of the thru-holes 1131 is less than or equal to 100 μm, and any two of the thru-holes 1131 adjacent to each other have a spacing S1131 therebetween that is within a range from 10 μm to 50 μm, thereby effectively preventing the structural strength of the main segment 11 from being affected, but the present disclosure is not limited thereto.

In summary, in the cantilever probe card device 100 (or the MEMS probe 1) of the present embodiment, the layout region 113 has the thru-holes 1131, so that the solution in the MEMS process can completely remove the photoresist layer by flowing through the thru-holes 1131, thereby increasing the production yield.

The above description describes the structure of the MEMS probe 1, and the following description describes connection relationship between the MEMS probes 1 and other components. The MEMS probes 1 are respectively fixed onto the soldering pads 21 of the substrate 2 through the soldering end portions 111 of the main segments 11. In other words, the soldering end portion 111 of any one of the MEMS probes 1 is soldered and fixed onto one of the soldering pads 21 through one of the solders 3, and the testing segments 13 of the MEMS probes 1 are arranged in one row along the arrangement direction D2.

In the present embodiment, the soldering manner between the soldering end portion 111 and the soldering pad 21 can be changed or adjusted according to design requirements. For example, the above soldering manner can be a surface mount technology (SMT) manner, a pin-in-paste (PIP) manner, or other soldering manners, but the present disclosure is not limited thereto.

Moreover, the thru-holes 1131 in one of the rows are arranged adjacent to the soldering end portion 111 and are each defined as a solder receiving hole 11311. Each of the solder receiving holes 11311 receives a part of the corresponding solder 3, but the present disclosure is not limited thereto. For example, in other embodiments of the present disclosure not shown in the drawings, according to design requirements, any one of the solder receiving holes 11311 can be provided without receiving any part of the corresponding solder 3.

Figure 4:
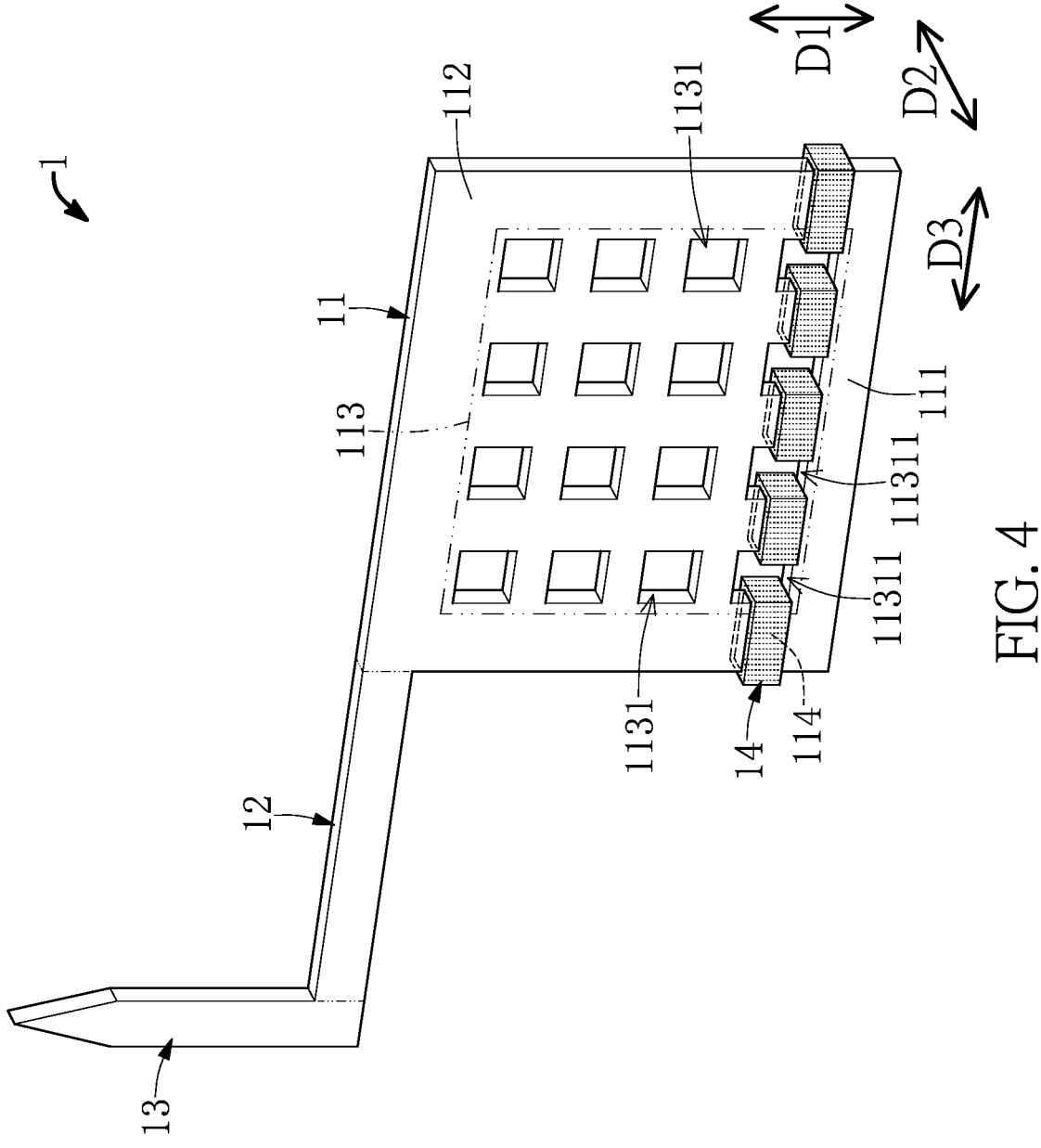
FIG. 4 is a schematic perspective view showing the MEMS probe of FIG. 1 in another configuration.
Figure 5:
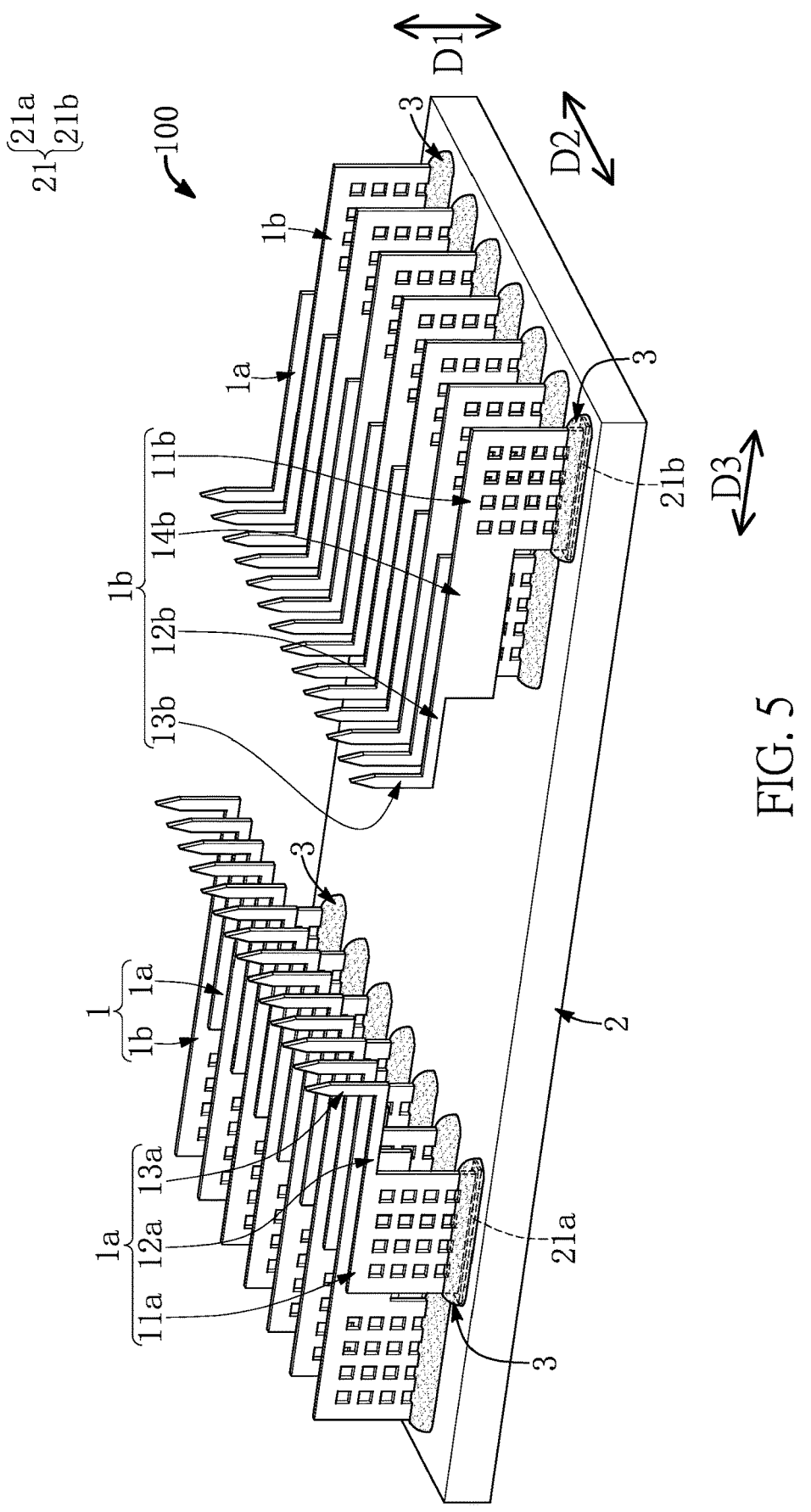
FIG. 5 is a schematic perspective view of the cantilever probe card device according to a second embodiment of the present disclosure.
Figure 6:
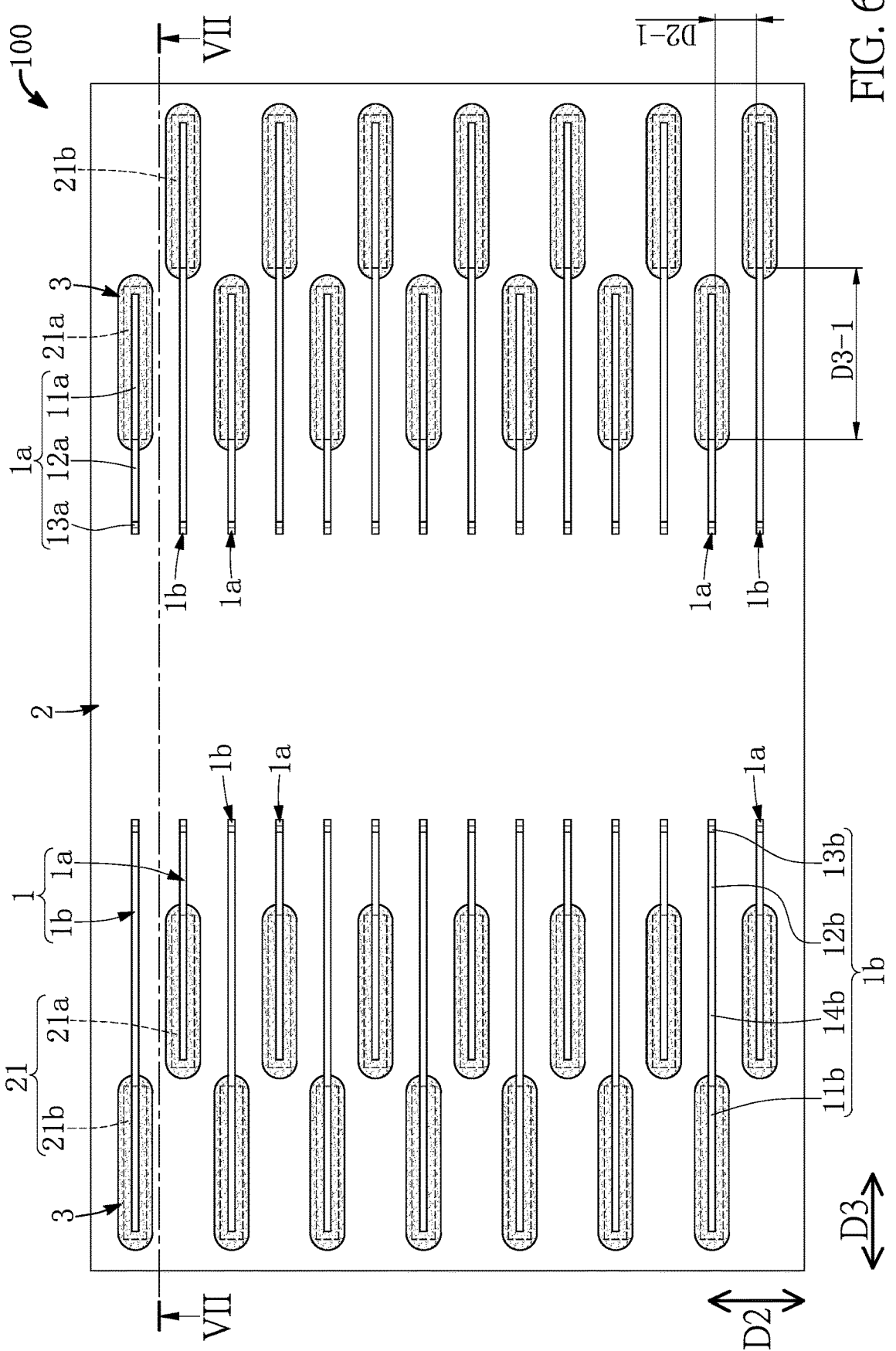
FIG. 6 is a schematic top view of FIG. 5.
Figure 7:
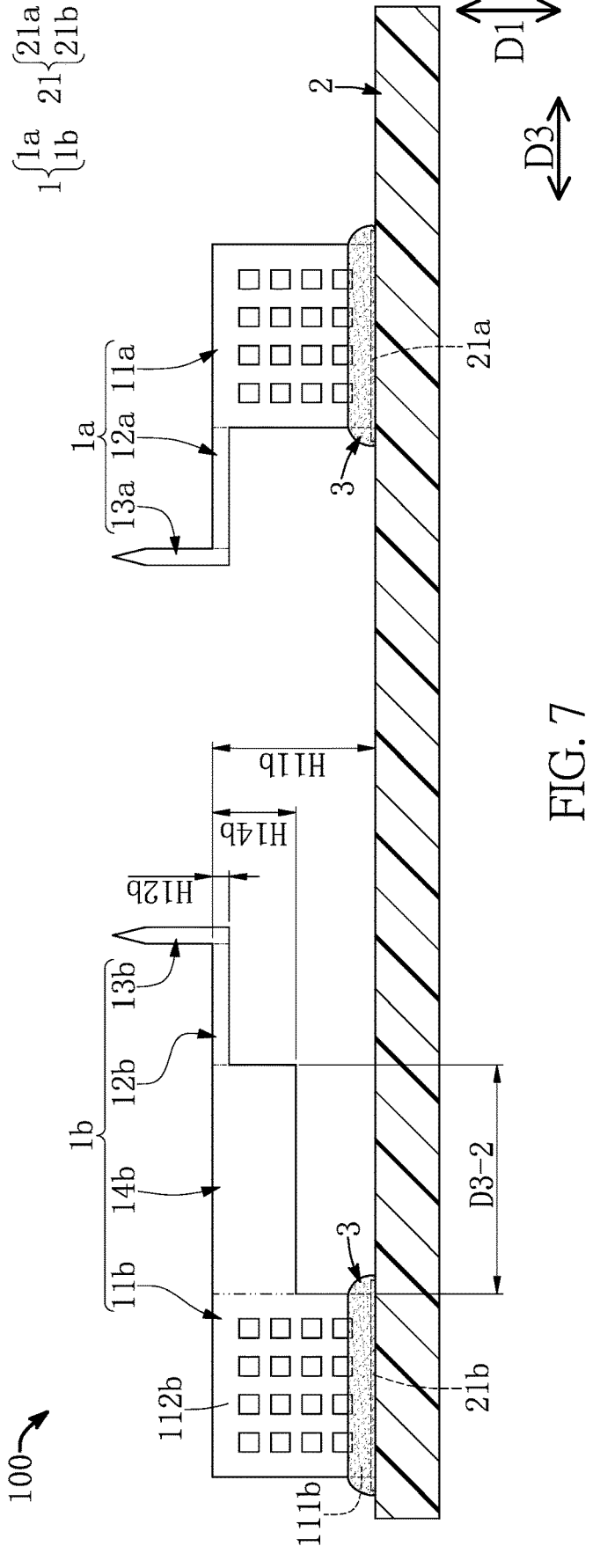
FIG. 7 is a schematic cross-sectional view taken along line VII-VII of FIG. 6.
Figure 8:
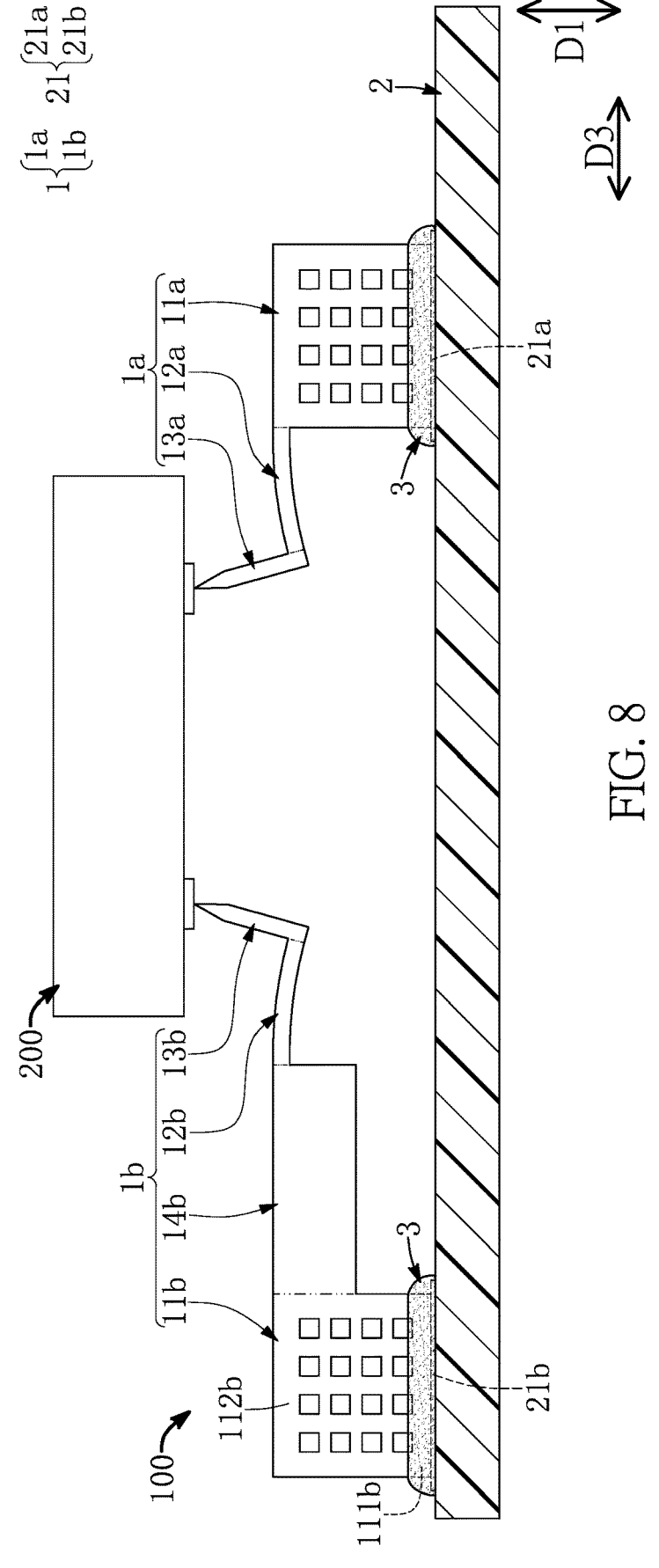
FIG. 8 is a schematic cross-sectional view showing the cantilever probe card device of FIG. 7 that abuts against a device under test (DUT)

As shown in FIG. 4 of the present embodiment, the MEMS probe 1 includes a plurality of supporting arms 114 that are arranged on the main segment 11 and a plurality of organic insulation layers 14 that respectively cover the supporting arms 114. The supporting arms 114 and the solder receiving holes 11311 are arranged in one row, and any two of the supporting arms 114 adjacent to each other are provided with one of the solder receiving holes 11311 therebetween. In other words, any one of the supporting arms 114 is preferably embedded in one of the organic insulation layers 14, thereby preventing the corresponding solder 3 from climbing along the supporting arms 114. Accordingly, a climbing height of the solder 3 climbing on the MEMS probe 1 can be precisely controlled for effectively maintaining the stability of the soldering process of the MEMS probe 1.

Second Embodiment

Referring to FIG. 5 to FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the soldering pads 21 include a plurality of first soldering pads 21a and a plurality of second pads 21b. The first soldering pads 21a are arranged in a first row along the arrangement direction D2, and the second soldering pads 21b are arranged in a second row along the arrangement direction D2. The second row is parallel to and spaced apart from the first row. The first soldering pads 21a of the first row are spaced apart from the second soldering pads 21b of the second row by an offset distance D3-1 along the extending direction D3.

The MEMS probes 1 include a plurality of first probes 1a and a plurality of second probes 1b. The first probes 1a and the second probes 1b are staggeredly arranged with each other along the arrangement direction D2 and are fixed onto the substrate 2. In the present embodiment, any one of the first probes 1a and an adjacent one of the second probes 1b have a spacing D2-1 along the arrangement direction D2. The spacing D2-1 is within a range from 20 μm to 200 μm.

Each of the first probes 1a has the main segment 11, the arm segment 12, and the testing segment 13. The main segment 11, the arm segment 12, and the testing segment 13 of each of the first probes 1a are respectively defined as a first main segment 11a, a first arm segment 12a, and a first testing segment 13a. In other words, the structure of the first probe 1a in the present embodiment is substantially identical to that of the MEMS probe 1 of the first embodiment.

As the second probes 1b in the present embodiment are of substantially the same structure (e.g., outer contours of the second probes 1b are flush with each other along the arrangement direction D2), the following description discloses the structure of just one of the second probes 1b for the sake of brevity, but the present disclosure is not limited thereto. For example, in other embodiments of the present disclosure not shown in the drawings, the second probes 1b can be of different structures.

The second probe 1b includes a second main segment 11b, an extending segment 14b connected to the second main segment 11b, a second arm segment 12b connected to the extending segment 14b, and a second testing segment 13b that is connected to the second arm segment 12b. In other words, the second main segment 11b, the extending segment 14b, the second arm segment 12b, and the second testing segment 13b are sequentially connected along the extending direction D3. Specifically, the extending segment 14b and the second testing segment 13b are respectively connected to two opposite ends of the second arm segment 12b, and are respectively located at two diagonal sides of the second arm segment 12b.

In other words, shapes of the first main segment 11a, the first arm segment 12a, and the first testing segment 13a of any one of the first probes 1a are respectively identical to shapes of the second main segment 11b, the second arm segment 12b, and the second testing segment 13b of any one of the second probes 1b, but the present disclosure is not limited thereto. For example, in other embodiments of the present disclosure not shown in the drawings, the shapes of the first main segment 11a, the first arm segment 12a, and the first testing segment 13a of any one of the first probes 1a can be respectively different from the shapes of the second main segment 11b, the second arm segment 12b, and the second testing segment 13b of any one of the second probes 1b.

In the present embodiment, the second main segment 11b has a substantially sheet-like shape (e.g., a rectangular sheet), and the second main segment 11b has a second soldering end portion 111b and a second extending end portion 112b respectively arranged on two opposite sides thereof along the predetermined direction D1. The extending segment 14b also has a substantially sheet-like shape, and one end of the extending segment 14b is connected to the second main segment 11b. The second arm segment 12b is an elongated structure along the extending direction D3, and one end of the second arm segment 12b is connected to another end of the extending segment 14b. The second testing segment 13b has an upright shape along the predetermined direction D1 and is connected to another end of the second arm segment 12b.

In other words, an edge of the second soldering end portion 112b is flush with an edge of the extending segment 14b and an edge of the second arm segment 12b so as to jointly form a straight line that is substantially perpendicular to an edge of the second testing segment 13b. Moreover, along the predetermined direction D1, the second main segment 11b has a main height H11b, the extending segment 14b has an extension height H14b that is within a range from 5% to 80% (e.g., 5% to 50%) of the main height H11b, and the second arm segment 12b has an arm height H12b that is within a range from 5% to 50% of the extension height H14b.

In other words, along the predetermined direction D1, the extension height H14b is calculated from a portion of the extending segment 14b connected to the second main segment 11b, and the arm height H12b is calculated from a portion of the extending segment 14b connected to the second arm segment 12b. The second arm segment 12b is elastically deformable, and the second main segment 11b and the extending segment 14b do not have any deformation.

Specifically, the extending segment 14b has an extension distance D3-2 along the extending direction D3. The extending direction D3-2 is within a range from 95% to 105% (e.g., 98% to 102%) of the offset distance D3-1. Accordingly, the second probes 1b can be arranged to eliminate effects generated from the offset distance D3-1 through the extending segments 14b, such that the second arm segments 12b of the second probes 1b and the first arm segments 12a of the first probes 1a can have substantially the same effect.

The following description describes connection relationships among the first probes 1a, the second probes 1b, and other components. The first main segment 11a of any one of the first probes 1a is soldered and fixed onto one of the first soldering pads 21a through one of the solders 3, the second main segment 11b of any one of the second probes 1b is soldered and fixed onto one of the second soldering pads 21b through one of the solders 3, and the first testing segments 13a of the first probes 1a and the second testing segments 13b of the second probes 1b are arranged in one row along the arrangement direction D2.

When the first testing segments 13a of the first probes 1a and the second testing segments 13b of the second probes 1b jointly abut against a device under test (DUT) 200, a pressure (or a contact force) generated in the first testing segment 13a of any one of the first probes 1a is within a range from 95% to 105% (e.g., 98% to 102%) of a pressure (or a contact force) generated in the second testing segment 13b of any one of the second probes 1b, each of the first probes 1a is preferably deformed only in the first arm segment 12a, and each of the second probes 1b is preferably deformed only in the second arm segment 12b, but the present disclosure is not limited thereto.

In summary, in the cantilever probe card device 100 of the present embodiment, each of the second probes 1b is provided with the extending segment 14b that is arranged between the second main segment 11b and the second arm segment 12b and that has a specific condition (e.g., the extension height H14b being within a range from 5% to 50% of the main height H11b), so that the second probes 1b and the first probes 1a can be in cooperation with each other for being fixed onto the second soldering pads 21b in the second row and the first soldering pads 21a in the first row, and the second probes 1b and the first probes 1a can have substantially the same pressure (or the same contact force).

Third Embodiment

Figure 9:
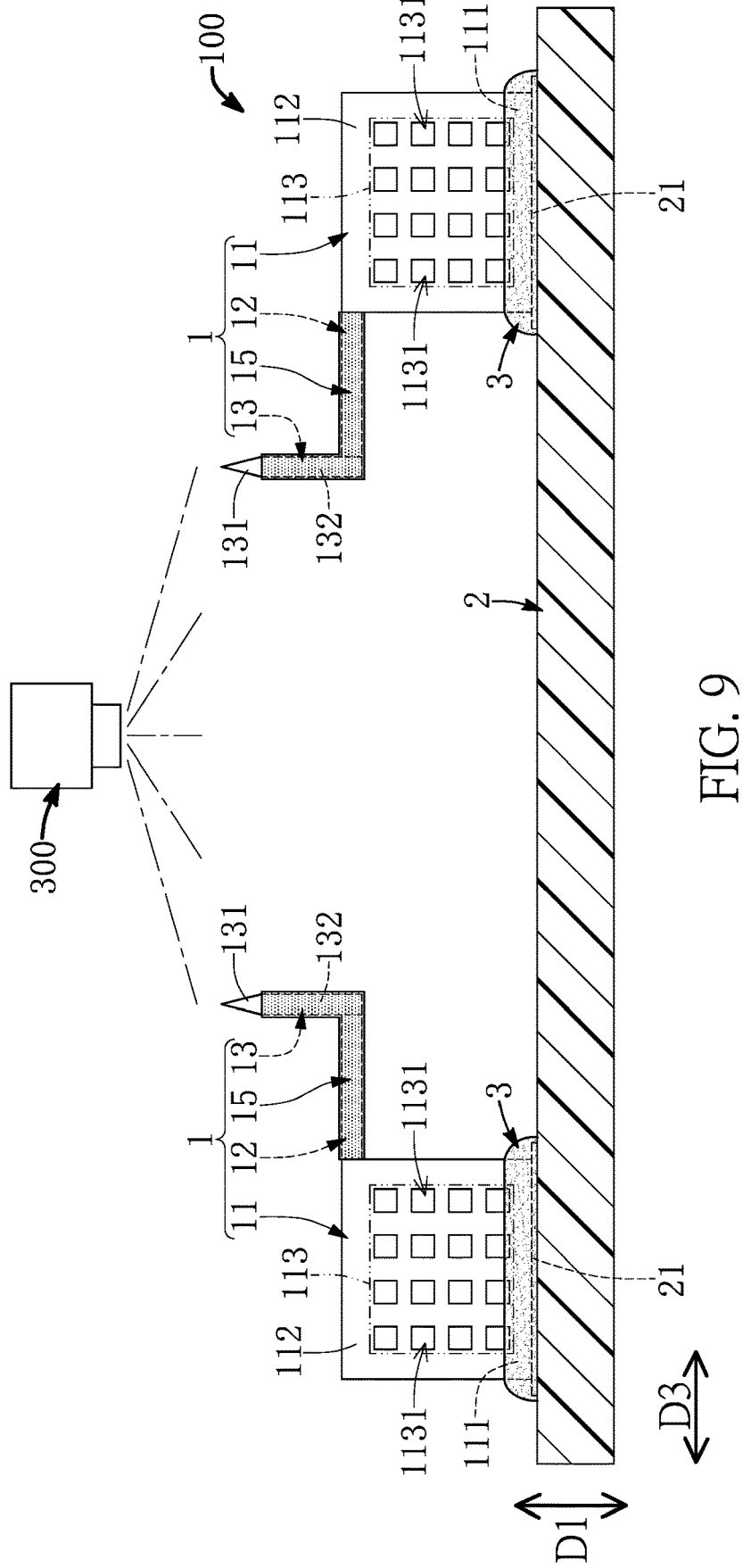
FIG. 9 is a schematic cross-sectional view of the cantilever probe card device according to a third embodiment of the present disclosure.

Referring to FIG. 9, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

In the present embodiment, the testing segment 13 of the MEMS probe 1 includes a pinpoint portion 131 and an upright portion 132 that connects the pinpoint portion 131 and the second arm segment 12, and the MEMS probe 1 further includes a light absorption coating layer 15. The upright portion 132 and the second arm segment 12 are covered by (or embedded in) the light absorption coating layer 15 (i.e., the light absorption coating layer 15 covers the upright portion 132, and further extends to cover the second arm segment 12), and the pinpoint portion 131 is exposed from the light absorption coating layer 15.

Accordingly, through the light absorption coating layer 15, the testing segment 13 and the second arm segment 12 of the MEMS probe 1 only form an observation point at the pinpoint portion 131 in an observation process of a detection apparatus 300, but the present disclosure is not limited thereto. For example, in other embodiments of the present disclosure not shown in the drawings, the light absorption coating layer 15 can only cover the upright portion 132 therein, so that the testing segment 13 only forms the observation point at the pinpoint portion 131 in the observation process of the detection apparatus 300.

Specifically, in the observation process, the detection apparatus 300 is operated by using light to irradiate on the MEMS probes 1 for obtaining the observation point of the pinpoint portion 131 of each of the MEMS probes 1. Moreover, a light absorption ratio of the light absorption coating layer 15 corresponding to the light is greater than or equal to 60%, and the light absorption coating layer 15 is preferably made of a polymer material, an organic material, a nano-material, or a light absorption composite material, but the present disclosure is not limited thereto.

In summary, in the cantilever probe card device 100 of the present embodiment, the MEMS probe 1 is provided with the light absorption coating layer 15 formed on a region thereof adjacent to the pinpoint portion 131, so that the detection apparatus 300 can precisely obtain the position of the pinpoint portion 131 for facilitating the operation of the cantilever probe card device 100.

Fourth Embodiment

Figure 10:
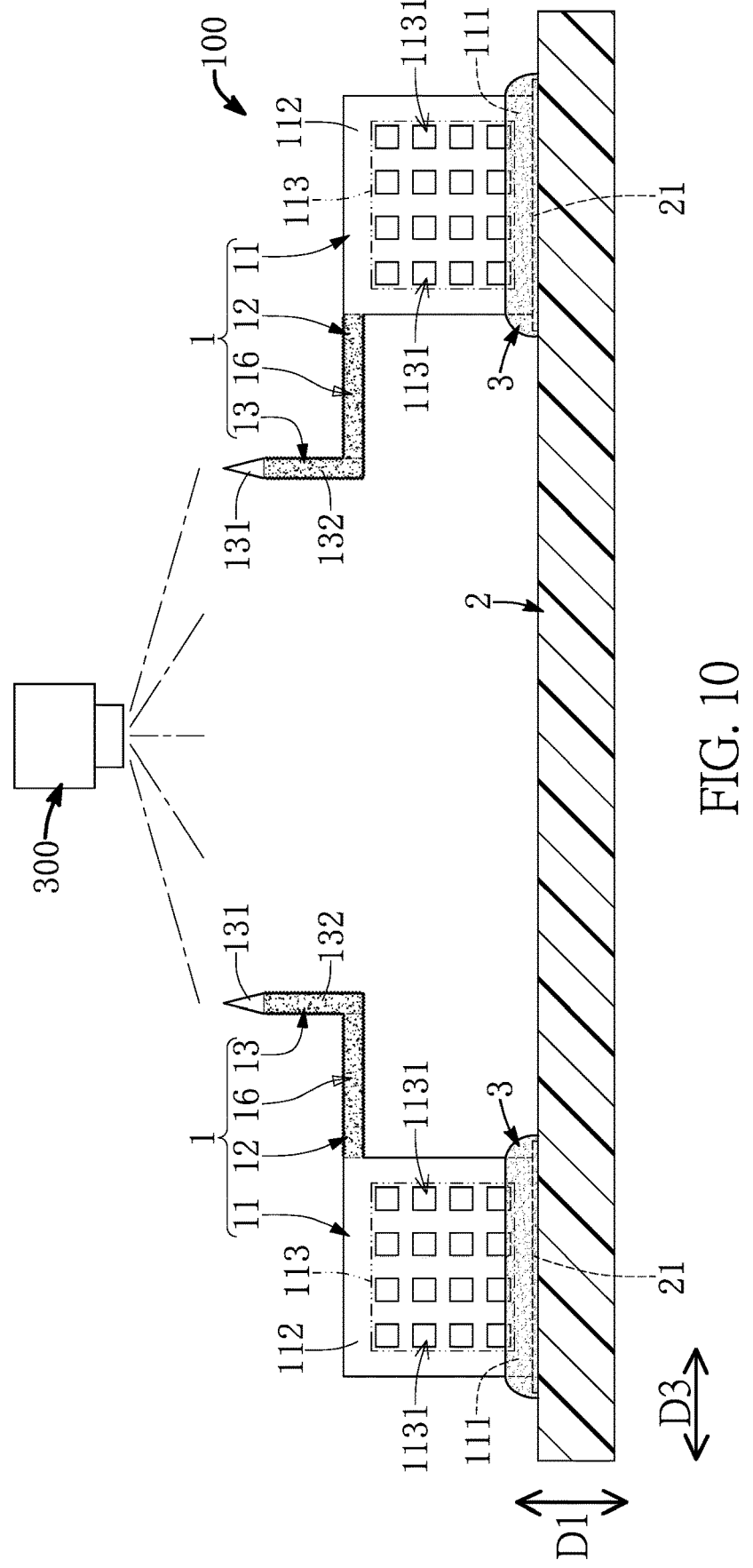
FIG. 10 is a schematic cross-sectional view of the cantilever probe card device according to a fourth embodiment of the present disclosure.

Referring to FIG. 10, a fourth embodiment of the present disclosure, which is similar to the first embodiment of the present disclosure, is provided. For the sake of brevity, descriptions of the same components in the first and fourth embodiments of the present disclosure will be omitted herein, and the following description only discloses different features between the first and fourth embodiments.

In the present embodiment, the testing segment 13 of the MEMS probe 1 includes a pinpoint portion 131 and an upright portion 132 that connects the pinpoint portion 131 and the second arm segment 12, and the MEMS probe 1 further has a roughened surface 16 arranged on an entirety of an outer surface of the upright portion 132. The roughened surface 16 has an arithmetic average roughness (Ra) within a range from 0.1 μm to 1 μm. In the present embodiment, the roughened surface 16 extends from the upright portion 132 to be further formed on (an entire outer surface of) the arm segment 12.

Accordingly, through the roughened surface 16, the second testing segment 13 and the second arm segment 12 of the MEMS probe 1 only form an observation point at the pinpoint portion 131 in an observation process of a detection apparatus 300, but the present disclosure is not limited thereto. For example, in other embodiments of the present disclosure not shown in the drawings, the roughened surface 16 can be only formed on the upright portion 132, thereby only forming the observation point at the pinpoint portion 131 in the observation process of the detection apparatus 300.

Specifically, in the observation process, the detection apparatus 300 is operated by using light to irradiate on the MEMS probes 1 for obtaining the observation point of the pinpoint portion 131 of each of the MEMS probes 1. Moreover, the roughened surface 16 is capable of scattering the light irradiated thereon, but the present disclosure is not limited thereto.

In summary, in the cantilever probe card device 100 of the present embodiment, the MEMS probe 1 is provided with the roughened surface 16 formed on a region thereof adjacent to the pinpoint portion 131, so that the detection apparatus 300 can precisely obtain the position of the pinpoint portion 131 for facilitating the operation of the cantilever probe card device 100.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A cantilever probe card device, comprising:

a substrate including a plurality of soldering pads;

a plurality of micro electro mechanical system (MEMS) probes fixed onto the substrate and each including:

an arm segment;

a main segment located at one side of the arm segment, wherein the main segment defines a layout region arranged inside of an outer contour thereof, and the main segment has a soldering end portion and an extending end portion respectively located at two opposite sides of the layout region along a predetermined direction; and a testing segment having an upright shape along the predetermined direction and connected to another side of the arm segment;

wherein, in each of the MEMS probes, the layout region has a plurality of thru-holes that occupy 3% to 70% of a region surroundingly defined by the outer contour, and wherein the layout region is spaced apart from the outer contour by a layout spacing that is greater than or equal to an inner diameter of any one of the thru-holes; and a plurality of solders, wherein the MEMS probes are fixed onto the soldering pads of the substrate through the soldering end portions of the main segments thereof, and the soldering end portion of each of the MEMS probes is soldered and fixed onto the corresponding soldering pad through one of the solders, wherein, in each of the MEMS probes, the thru-holes are in a matrix arrangement having a plurality of rows, the thru-holes in one of the rows are arranged adjacent to the soldering end portion and are each defined as a solder receiving hole that receives a part of the corresponding solder;

wherein each of the MEMS probes includes a plurality of supporting arms and a plurality of organic insulation layers that respectively cover the supporting arms; and wherein, in each of the MEMS probes, the supporting arms and the solder receiving holes are arranged in one row, and any two of the supporting arms adjacent to each other are provided with one of the solder receiving holes therebetween.

2. The cantilever probe card device according to claim 1, wherein, in each of the MEMS probes, the main segment is divided into four quadrants by taking a center point thereof as an origin point, and a ratio of thru-holes in any one of the four quadrants is within a range from 95% to 105% of a ratio of the thru-holes in another one of the four quadrants.

3. The cantilever probe card device according to claim 1, wherein the layout spacing is within a range from 20 μm to 100 μm, the inner diameter of any one of the thru-holes is less than or equal to 100 μm, and any two of the thru-holes adjacent to each other have a spacing therebetween that is within a range from 10 μm to 50 μm.

4. The cantilever probe card device according to claim 1, wherein the soldering pads include a plurality of first soldering pads and a plurality of second soldering pads, wherein the first soldering pads are arranged in a first row along an arrangement direction perpendicular to the predetermined direction, and the second soldering pads are arranged in a second row along the arrangement direction, wherein the second row is parallel to and spaced apart from the first row, and wherein each of the MEMS probes includes:

a plurality of first probes each having the main segment, the arm segment, and the testing segment, wherein the main segment, the arm segment, and the testing segment of each of the first probes are respectively defined as a first main segment, a first arm segment, and a first testing segment; and a plurality of second probes each having:

the main segment defined as a second main segment and having a main height along the predetermined direction;

an extending segment connected to the second main segment, wherein the extending segment has an extension height along the predetermined direction, and wherein the extension height is within a range from 5% to 80% of the main height;

the arm segment defined as a second arm segment and connected to the extending segment; and

the testing segment defined as a second testing segment, wherein the second testing segment has an upright shape along the predetermined direction and is connected to the second arm segment;

wherein the first main segments of the first probes are fixed onto the first soldering pads, the second main segments of the second probes are fixed onto the second soldering pads, and the first testing segments of the first probes and the second testing segments of the second probes are arranged in one row along the arrangement direction;

wherein, when the first testing segments of the first probes and the second testing segments of the second probes jointly abut against a device under test (DUT), each of the first probes is only deformed in the first arm segment, and each of the second probes is only deformed in the second arm segment.

5. The cantilever probe card device according to claim 4, wherein the first soldering pads of the first row are spaced apart from the second soldering pads of the second row by an offset distance along an extending direction that is perpendicular to the arrangement direction and the predetermined direction, and the extending segment of any one of the second probes has an extension distance along the extending direction, and wherein the extension distance is within a range from 95% to 105% of the offset distance.

6. The cantilever probe card device according to claim 5, wherein, when the first testing segments of the first probes and the second testing segments of the second probes jointly abut against the DUT, a pressure generated in the first testing segment of any one of the first probes is within a range from 95% to 105% of a pressure generated in the second testing segment of any one of the second probes.

7. The cantilever probe card device according to claim 4, wherein any two of the second probes adjacent to each other are provided with one of the first probes therebetween, and any one of the first probes and an adjacent one of the second probes have a spacing along the arrangement direction, and wherein the spacing is within a range from 20 μm to 200 μm.

8. A micro electro mechanical system (MEMS) probe, comprising:

an arm segment;

a main segment located at one side of the arm segment, wherein the main segment defines a layout region arranged inside of an outer contour thereof, and the main segment has a soldering end portion and an extending end portion respectively located at two opposite sides of the layout region along a predetermined direction; and a testing segment having an upright shape along the predetermined direction and connected to another side of the arm segment;

wherein the layout region has a plurality of thru-holes that occupy 3% to 70% of a region surroundingly defined by the outer contour, and wherein the layout region is spaced apart from the outer contour by a layout spacing that is greater than or equal to an inner diameter of any one of the thru-holes, wherein the MEMS probe includes a plurality of supporting arms and a plurality of organic insulation layers that respectively cover the supporting arms, wherein the thru-holes are in a matrix arrangement having a plurality of rows, and the thru-holes in one of the rows are arranged adjacent to the soldering end portion and are each defined as a solder receiving hole, and wherein the supporting arms and the solder receiving holes are arranged in one row, and any two of the supporting arms adjacent to each other are provided with one of the solder receiving holes therebetween.

9. A cantilever probe card device, comprising:

a substrate including a plurality of soldering pads; and a plurality of micro electro mechanical system (MEMS) probes fixed onto the substrate and each including:

an arm segment;

a main segment located at one side of the arm segment, wherein the main segment defines a layout region arranged inside of an outer contour thereof, and the main segment has a soldering end portion and an extending end portion respectively located at two opposite sides of the layout region along a predetermined direction; and a testing segment having an upright shape along the predetermined direction and connected to another side of the arm segment;

wherein, in each of the MEMS probes, the layout region has a plurality of thru-holes that occupy 3% to 70% of a region surroundingly defined by the outer contour, and wherein the layout region is spaced apart from the outer contour by a layout spacing that is greater than or equal to an inner diameter of any one of the thru-holes;

wherein the MEMS probes are fixed onto the soldering pads of the substrate through the soldering end portions of the main segments thereof, wherein the soldering pads include a plurality of first soldering pads and a plurality of second soldering pads, wherein the first soldering pads are arranged in a first row along an arrangement direction perpendicular to the predetermined direction, and the second soldering pads are arranged in a second row along the arrangement direction, wherein the second row is parallel to and spaced apart from the first row, and wherein each of the MEMS probes includes:

a plurality of first probes each having the main segment, the arm segment, and the testing segment, wherein the main segment, the arm segment, and the testing segment of each of the first probes are respectively defined as a first main segment, a first arm segment, and a first testing segment; and a plurality of second probes each having:

the main segment defined as a second main segment and having a main height along the predetermined direction;

an extending segment connected to the second main segment, wherein the extending segment has an extension height along the predetermined direction, and wherein the extension height is within a range from 5% to 80% of the main height;

the arm segment defined as a second arm segment and connected to the extending segment; and the testing segment defined as a second testing segment, wherein the second testing segment has an upright shape along the predetermined direction and is connected to the second arm segment;

wherein the first main segments of the first probes are fixed onto the first soldering pads, the second main segments of the second probes are fixed onto the second soldering pads, and the first testing segments of the first probes and the second testing segments of the second probes are arranged in one row along the arrangement direction;

wherein, when the first testing segments of the first probes and the second testing segments of the second probes jointly abut against a device under test (DUT), each of the first probes is only deformed in the first arm segment, and each of the second probes is only deformed in the second arm segment.

10. The cantilever probe card device according to claim 9, wherein the first soldering pads of the first row are spaced apart from the second soldering pads of the second row by an offset distance along an extending direction that is perpendicular to the arrangement direction and the predetermined direction, and the extending segment of any one of the second probes has an extension distance along the extending direction, and wherein the extension distance is within a range from 95% to 105% of the offset distance.

11. The cantilever probe card device according to claim 10, wherein, when the first testing segments of the first probes and the second testing segments of the second probes jointly abut against the DUT, a pressure generated in the first testing segment of any one of the first probes is within a range from 95% to 105% of a pressure generated in the second testing segment of any one of the second probes.

12. The cantilever probe card device according to claim 9, wherein any two of the second probes adjacent to each other are provided with one of the first probes therebetween, and any one of the first probes and an adjacent one of the second probes have a spacing along the arrangement direction, and wherein the spacing is within a range from 20 μm to 200 μm.

\* \* \* \* \*